(12) United States Patent
Tonedachi

(10) Patent No.: US 11,367,715 B2
(45) Date of Patent: Jun. 21, 2022

(54) PHOTORELAY

(71) Applicants: Kabushiki Kaisha Toshiba, Tokyo (JP); Toshiba Electronic Devices & Storage Corporation, Tokyo (JP)

(72) Inventor: Tatsuo Tonedachi, Yamato Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,487

(22) Filed: Sep. 4, 2020

(65) Prior Publication Data

US 2021/0175221 A1 Jun. 10, 2021

(30) Foreign Application Priority Data

Dec. 4, 2019 (JP) .............................. JP2019-219567

(51) Int. Cl.
*H01L 25/16* (2006.01)
*H01L 23/00* (2006.01)
(Continued)

(52) U.S. Cl.
CPC .......... *H01L 25/167* (2013.01); *H01L 23/145* (2013.01); *H01L 23/49838* (2013.01);
(Continued)

(58) Field of Classification Search
CPC ....... H01L 23/00; H01L 23/14; H01L 23/145; H01L 23/498; H01L 23/49838; H01L 24/48; H01L 24/167; H01L 2224/48137; H01L 2924/1579; H01L 2924/13091; H01L 2924/12043; H01L 2924/12041; H01L 2924/07025; H01L 25/16; H01L 25/167; H01L 23/49; H01L 24/05; H01L 24/06; H01L 24/32; H01L 24/73; H01L 2224/45099; H01L 2224/48091; H01L 2224/73265; H01L 2224/32225; H01L 2224/32145; H01L 2924/00012;
(Continued)

(56) References Cited

U.S. PATENT DOCUMENTS

| 2009/0146298 A1* | 6/2009 | Masumoto ........ H01L 23/49816 257/737 |
| 2015/0069423 A1* | 3/2015 | Yamamoto ............ H01L 31/173 257/82 |
| 2016/0369053 A1 | 12/2016 | Chiang et al. |

FOREIGN PATENT DOCUMENTS

| JP | H7-186324 A | 7/1995 |
| JP | 2001-177118 A | 6/2001 |

(Continued)

*Primary Examiner* — Chuong A Luu
(74) *Attorney, Agent, or Firm* — Allen & Overy LLP

(57) ABSTRACT

A photorelay of an embodiment includes a polyimide substrate having a first surface and a second surface on an opposite side of the polyimide substrate from the first surface, the polyimide substrate having a thickness equal to or more than 10 μm and equal to or less than 120 μm, an input terminal provided on the second surface, an output terminal provided on the second surface, a light receiving element provided on the first surface, a light emitting element provided on the light receiving element, and a MOSFET provided on the first surface.

5 Claims, 4 Drawing Sheets

(51) Int. Cl.
*H01L 23/14* (2006.01)
*H01L 23/498* (2006.01)
*H03K 17/785* (2006.01)

(52) U.S. Cl.
CPC ........... *H01L 24/48* (2013.01); *H03K 17/785* (2013.01); *H01L 2224/48137* (2013.01); *H01L 2224/48227* (2013.01); *H01L 2924/07025* (2013.01); *H01L 2924/12041* (2013.01); *H01L 2924/12043* (2013.01); *H01L 2924/13091* (2013.01); *H01L 2924/1579* (2013.01)

(58) Field of Classification Search
CPC ..... H01L 2924/00014; H01L 2924/181; H01L 2224/48227; H03K 17/785
USPC .......................................................... 257/82
See application file for complete search history.

(56) References Cited

FOREIGN PATENT DOCUMENTS

| JP | 2002-359392 A | 12/2002 |
|----|---------------|---------|
| JP | 4131524 B2 | 8/2008 |
| JP | H4-320057 B2 | 8/2009 |
| JP | 2017-08311 A | 1/2017 |
| JP | H6-140739 B2 | 5/2017 |

* cited by examiner

PHOTORELAY

CROSS-REFERENCE TO RELATED APPLICATION

This application is based upon and claims the benefit of priority from Japanese Patent Application No. 2019-219567, filed on Dec. 4, 2019, the entire contents of which are incorporated herein by reference.

FIELD

Embodiments described herein relate generally to a photorelay.

BACKGROUND

A photorelay including an optically-coupled insulation circuit is capable of converting an input electrical signal into an optical signal using a light emitting element, receiving the optical signal using a light receiving element, and then outputting an electrical signal. Therefore, such a photorelay can transfer an electrical signal in a state where input and output are isolated from each other.

A large number of photorelays for AC load are used in a semiconductor tester configured to inspect a semiconductor integrated circuit or the like. In response to a demand for making bandwidths of a dynamic random access memory (DRAM) and the like wider, a photorelay allowing a high-frequency signal having a frequency higher than several GHz to pass with low loss is required.

Such a photorelay includes an output circuit signal-switchable, using a MOSFET, in response to on/off of an input electrical signal. Therefore, when a light emitting element, a light receiving element, and a MOSFET are mounted on a mounting substrate of the semiconductor tester, a photorelay exhibiting high high frequency pass characteristics is required.

DETAILED DESCRIPTION

A photorelay of an embodiment includes a polyimide substrate having a first surface and a second surface on an opposite side of the polyimide substrate from the first surface, the polyimide substrate having a thickness equal to or more than 10 μm and equal to or less than 120 μm, an input terminal provided on the second surface, an output terminal provided on the second surface, a light receiving element provided on the first surface, a light emitting element provided on the light receiving element, and a MOSFET provided on the first surface.

Hereinafter, embodiments of the present disclosure will be described with reference to the drawings.

Figure 1:
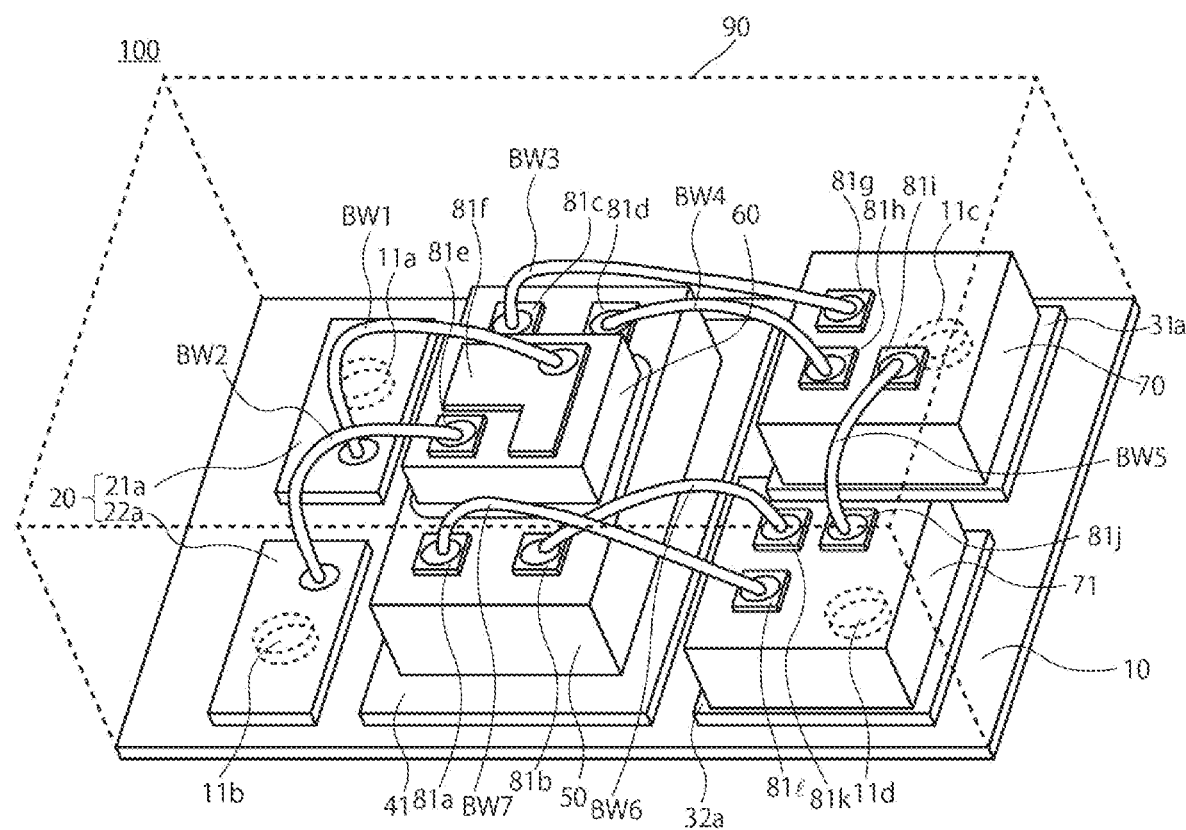
FIG. 1 is a schematic perspective view of a photorelay according to an embodiment.
Figure 2:
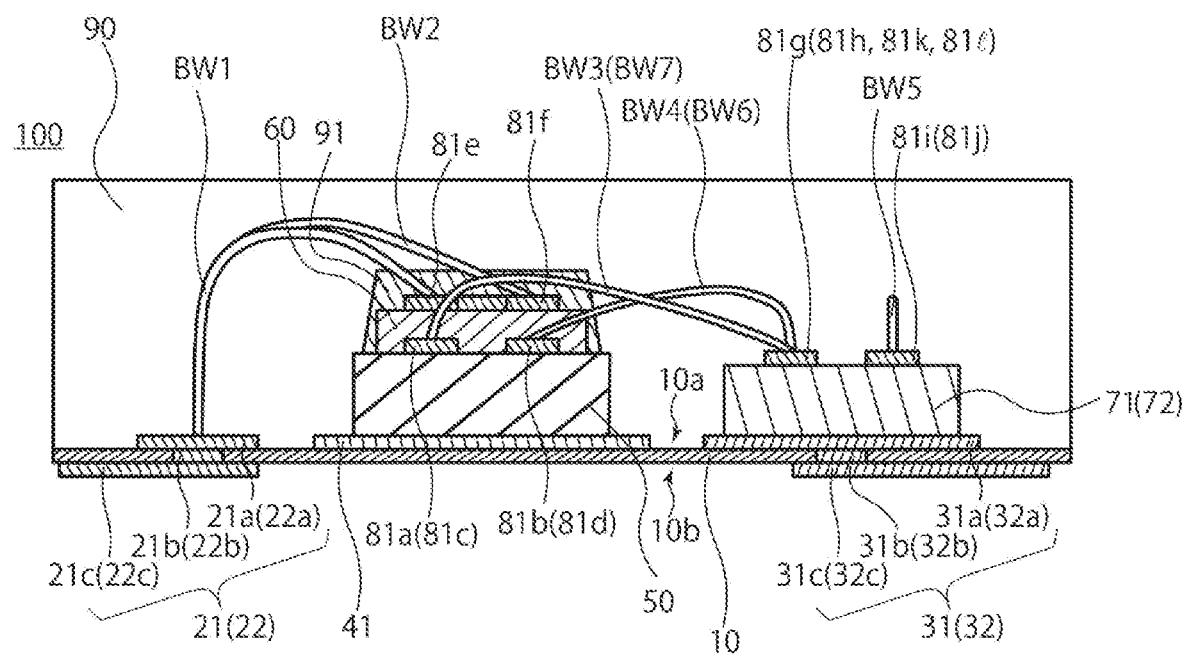
FIG. 2 is a schematic cross-sectional view of the photorelay according to the embodiment.

FIG. 1 is a schematic perspective view of a photorelay according to an embodiment. FIG. 2 is a schematic cross-sectional view of the photorelay according to the embodiment.

The photorelay 100 includes a packaging member 5, a MOSFET 70 (71) bonded to output terminal units 31, 32 of the packaging member 5, a light receiving element 50 bonded to a die pad 41, the light receiving element 50 having a light receiving surface on its upper side, a light emitting element 60 configured to irradiate the light receiving surface with light, an adhesive layer 52 having light transparency and electrical insulation, the adhesive layer 52 causing the light emitting element 60 to be bonded to the upper side of the light receiving element 50, and a first encapsulating resin layer 90. As the light emitting element 60, for example, a light emitting diode (LED) or the like may be used. Further, as the light receiving element 50, a photodiode, a phototransistor, a light receiving IC, or the like may be used.

In FIGS. 1 and 2, the MOSFET 70 (71) includes two elements connected to each other via a common source. Note that the present disclosure is not limited to such a structure, and only one MOSFET may be provided. When a chip back surface of each of the MOSFETs 70 serves as a drain, the output terminal units 31, 32 are connected to the respective drains of the MOSFETs.

The first encapsulating resin layer 90 covers the light receiving element 50, the light emitting element 60, the MOSFETs 70 (71), and a first surface 10a of a polyimide substrate 10 to protect the inside. The light emitting element 60 may be further encapsulated in a second encapsulating resin 91.

The polyimide substrate 10 has the first surface 10a with a rectangular shape and a second surface 10b on the opposite side of the polyimide substrate 10 from the first surface 10a. Further, a through hole 11 (11a, 11b, 11c, 11d) communicating from the first surface 10a to the second surface 10b may be further provided.

The polyimide substrate 10 preferably has a thickness equal to or more than 10 μm and equal to or less than 120 μm. The use of such an ultra-thin polyimide substrate 10 makes it possible to increase pass characteristics over a high frequency band such as a band of from 15 GHz to 30 GHz. From the viewpoint of increasing the pass characteristics over a high frequency band, it is more preferable that the thickness of the polyimide substrate 10 be equal to or more than 10 μm and equal to or less than 100 μm. From the viewpoint of increasing the pass characteristics over a high frequency band equal to or higher than 20 GHz, it is preferable that the thickness of the polyimide substrate 10 be equal to or more than 10 μm and equal to or less than 60 μm, and more preferable that the thickness be equal to or more than 10 μm and equal to or less than 30 μm. It is preferable that making the thickness of the polyimide substrate 10 thin, for example, equal to or less than 60 μm further increase the pass characteristics over a higher frequency band. Since the polyimide substrate 10 is thin, plating formed on the polyimide substrate 10 easily fills the through hole 11; therefore, the high frequency pass characteristics can be increased in a manner that depends on not only the characteristics of the substrate itself but also the characteristics of wiring.

An input terminal unit 20 includes, for example, two input terminal units 21, 22. The input terminal units 21, 22 preferably have a thickness equal to or more than 5 μm and equal to or less than 50 μm. The input terminal units 21, 22 have their respective first conductive regions 21a, 22a provided on the first surface 10a, the first conductive regions 21a, 22a being respectively connected, via via wirings 21b, 22b provided in the through holes 11a, 11b, to input terminals 21c, 22c provided on the second surface 10b. The first conductive regions 21a, 22a are so-called pads. The first conductive regions 21a, 22a preferably have a thickness equal to or more than 5 µm and equal to or less than 50 µm.

The output terminal unit includes, for example, two output terminal units 31, 32. The output terminal units 31, 32 preferably have a thickness equal to or more than 5 µm and equal to or less than 50 µm. The output terminal units 31, 32 have their respective second conductive regions 31a, 32a provided on the first surface 10a, the second conductive regions 31a, 32a being respectively connected, via via wirings 31b, 32b provided through the through holes 11c, 11d, to output terminals 31c, 32c provided on the second surface 10b. The second conductive regions 31a, 32a are so-called pads. When the second conductive regions 31a, 32a (pads) are too thick, the high frequency pass characteristics deteriorate. The second conductive regions 31a, 32a preferably have a thickness equal to or more than 5 µm and equal to or less than 50 µm.

The input terminal units 21, 22, the output terminal units 31, 32, and the die pad 41 are each made of a Cu foil provided on the surface of the polyimide substrate 10 and a plating layer such as Ni or Au laminated on the Cu foil. Further, when viewed from above, the input terminal units 21, 22, the output terminal units 31, 32, and the die pad 41 are spaced apart and isolated from each other on the polyimide substrate 10.

It is preferable that a plurality of the through holes 11c (via wiring 31b) and a plurality of the through holes 11d (via wiring 32b) be provided on the MOSFETs 70, 71 side. Providing the plurality of through holes 11c and the plurality of through holes 11d makes it possible to increase the high frequency pass characteristics.

The via wirings 31b, 32b provided in the through holes 11c, 11d on the MOSFETs 70, 71 side preferably have a diameter equal to or more than 20 µm and equal to or less than 150 µm. Making the diameter of the through holes 11c, 11d too large makes plating difficult to be applied, thereby causing the via wirings 31b, 32b to inadequacy fill the through holes 11c, 11d, which is not preferable. More specifically, each of the via wirings 31b, 32b which connects the output terminal units 31, 32 preferably includes a plurality of via wirings having diameter equal to or more than 40 µm and equal to or less than 60 µm or single via wiring having diameter equal to or more than 110 µm and equal to or less than 130 µm. If the above conditions are met, the polyimide substrate 10 has a plurality of through holes having diameter equal to or more than 40 µm and equal to or less than 60 µm or single through hole having diameter equal to or more than 110 µm and equal to or less than 130 µm. If the polyimide substrate 10 has a thickness equal to or more than 40 µm and equal to or less than 60 µm, each of the via wirings 31b, 32b which connects the output terminal units 31, 32 more preferably includes a plurality of via wirings having diameter equal to or more than 40 µm and equal to or less than 60 µm or single via wiring having diameter equal to or more than 110 µm and equal to or less than 130 µm. If the diameter of the via wirings 31b, 32b is equal to or more than 110 µm and equal to or less than 130 µm, a conformal via wiring can be used for the via wirings 31b, 32b.

The input terminal unit 21 is electrically connected to a cathode pad 81f of the light emitting element 60 via a bonding wire BW1.

The input terminal unit 22 is electrically connected to an anode pad 81e of the light emitting element 60 via a bonding wire BW2.

The light receiving element 50 is electrically connected to gates and sources of the MOSFETs 70, 71 via bonding wires BW3, BW4, BW6, BW7. Pads 81a, 81b, 81c, 81d of the light receiving element are electrically connected to pads 81g, 81h, 81k, 81l of the MOSFETs 70, 71 via the bonding wires BW3, BW4, BW6, BW7.

The MOSFET 70 (source) and the MOSFET 71 (source) are electrically connected to each other via a bonding wire BW5 connecting the respective pads 81i, 81j of the MOSFETs 70, 71.

Figure 3:
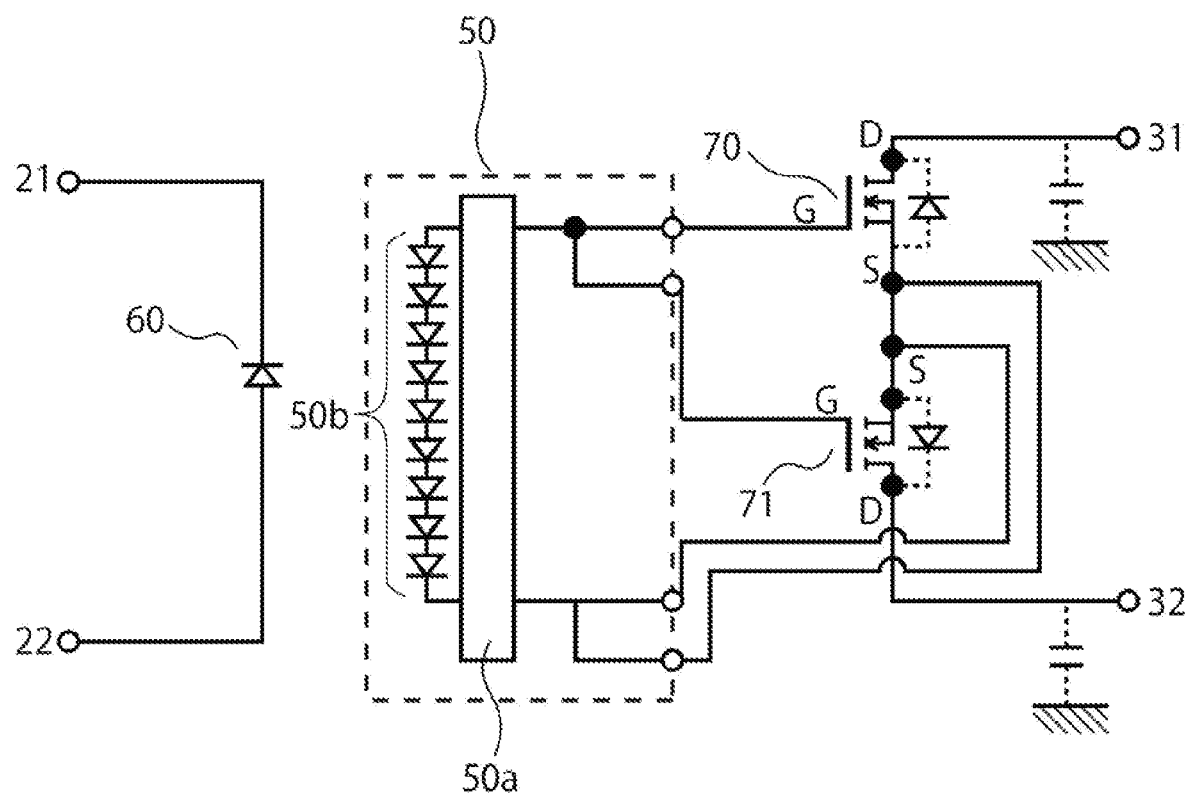
FIG. 3 is a structure diagram of the photorelay according to the embodiment.

FIG. 3 is a structure diagram of the photorelay according to the first embodiment.

The light receiving element 50 may further include a control circuit 50a. The control circuit 50a is connected to both first and second electrodes of a photodiode array 50b. This structure allows a voltage to be applied to each gate of the MOSFETs 70 connected to each other via a common source. Further, the control circuit 50a includes a resistor or the like, allowing a discharge to occur when the MOSFETs 70 make a transition from on to off to shorten the fall time.

The MOSFETs 70, 71 may be, for example, of an n-channel enhancement type. In FIG. 3, the gates G of the MOSFETs 70 are connected to an anode of the photodiode array 50b. Their respective sources S are connected to a cathode of the photodiode array 50b, and their respective drains D are connected to the output terminal units 31, 32.

When an optical signal is on, both the MOSFETs 70, 71 become on to connect to an external circuit including a power supply and a load via the output terminal units 31, 32. On the other hand, when the optical signal is off, both the MOSFETs 70, 71 become off to separate from the external circuit. The common-source connection enables linear output and facilitates switching of a high-frequency signal.

When the two MOSFETs 70, 71 connected to each other via a common source are on, a high-frequency signal is supplied to the load. For example, when the number of bonding wires connecting the two source electrodes S is increased to two or more, source inductance can be reduced. Further, when the two or more bonding wires are made non-parallel to each other, the source inductance can be further reduced. Further, when the bonding wires adjacent to the MOSFETs 70, 71 are made larger in diameter than the bonding wires adjacent to the light emitting element 60, wire inductance can be reduced. This in turn makes it possible to reduce transmission loss.

Figure 4:
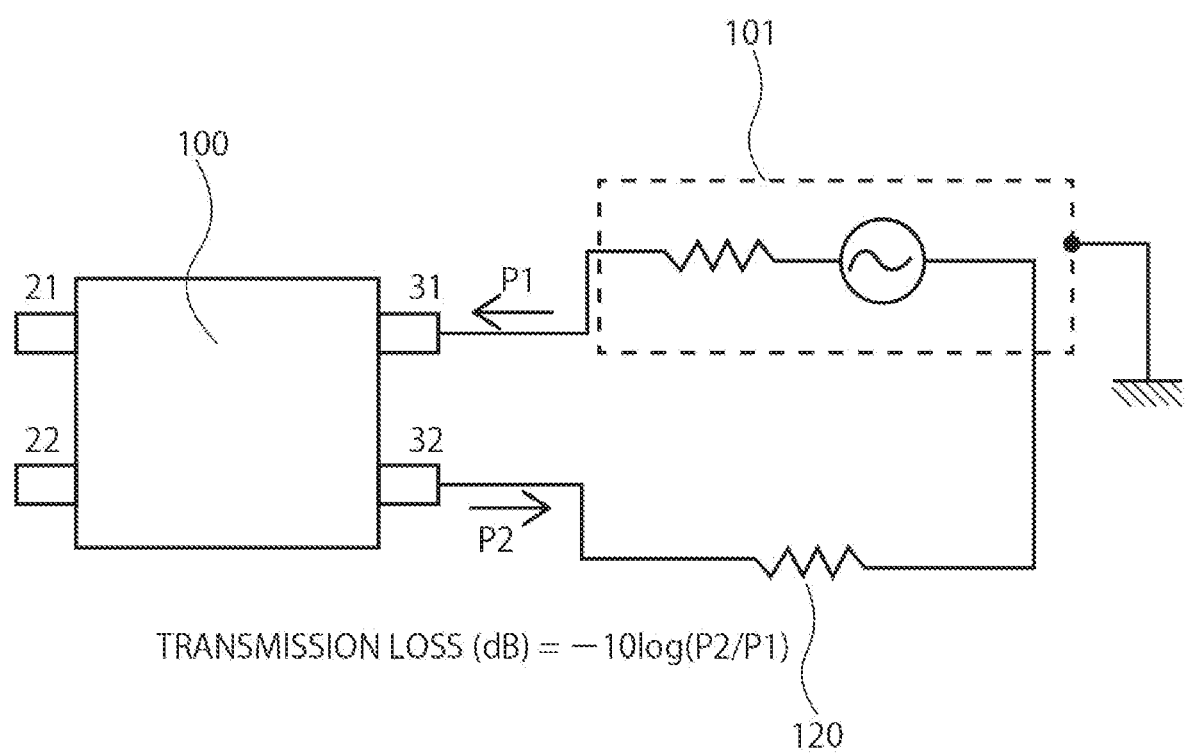
FIG. 4 is an example of a diagram of a measurement circuit configured to measure transmission loss.

FIG. 4 shows an example of a measurement circuit configured to measure transmission loss. For example, when the light emitting element such as an LED is on in response to an input electrical signal, the MOSFETs become on to allow a high-frequency signal to flow from a high-frequency signal source 101 to a load 120. When the MOSFETs have a vertical structure, a back side of the chip may serve as a drain electrode. Therefore, parasitic (stray) capacitance Cst is generated between each MOSFET and a corresponding ground electrode in close proximity to each other.

A part between the output terminal units 31, 32 of the photorelay acts as a relay terminal. The transmission loss corresponds to insertion loss when the relay is conducting. For example, when an input power is denoted by P1, and an output power is denoted by P2, the transmission loss is expressed by the following equation.

$$\text{Transmission loss (dB)} = -10 \log(P2/P1)$$

Figure 5:
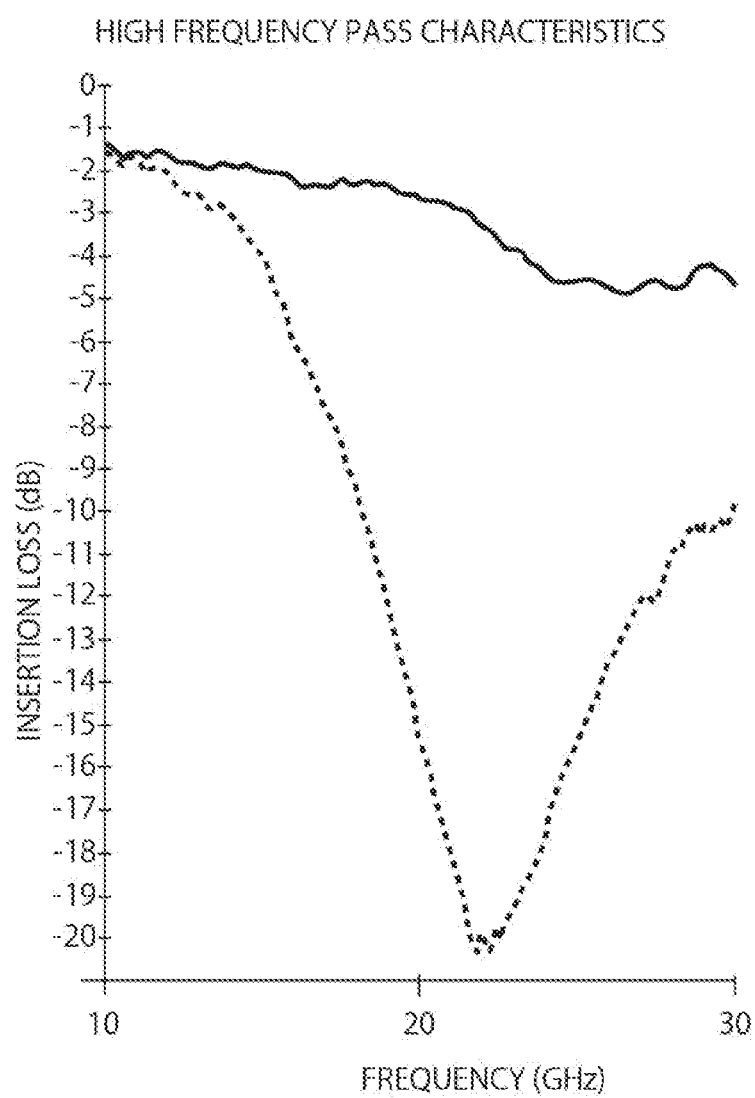
FIG. 5 is a graph showing high frequency pass characteristics with respect to a frequency.

FIG. 5 is a graph showing high frequency pass characteristics of the photorelay with respect to a frequency.

The vertical axis represents the insertion loss (dB), and the horizontal axis represents the frequency (Hz). The solid line represents high frequency pass characteristics of a photorelay including the polyimide substrate 10 having a thickness of 25 μm. The dotted line represents high frequency pass characteristics of a photorelay including a glass epoxy substrate, rather than the polyimide substrate 10, having a thickness of 400 μm. The insertion loss is based on pass characteristics at 10 MHz. Around 10 GHz, there is no large difference between the photorelay including the polyimide substrate 10 and the photorelay including the glass epoxy substrate. However, the photorelay including the glass epoxy substrate is large in loss of about −20 dB with 20 odd GHz as the largest, and the loss reaches −3 dB at about 13 GHz. On the other hand, when the photorelay includes the polyimide substrate 10, the loss gradually increases from 10 GHz to 30 GHz, showing that the photorelay has an extremely excellent high frequency pass characteristics with −5 dB as the largest loss.

The photorelay 100 according to the embodiment can reduce transmission loss. Therefore, high frequency pass characteristics of semiconductor devices including ultra-high speed DRAMs based on the next-generation standard can be measured with high accuracy and at high speed.

Such photorelays are widely applicable to industrial equipment including a semiconductor tester for inspecting ICs and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photorelay comprising:
   a polyimide substrate having a first surface and a second surface on an opposite side of the polyimide substrate from the first surface, the polyimide substrate having a thickness equal to or more than 10 μm and equal to or less than 120 μm;
   an input terminal provided on the second surface;
   an output terminal provided on the second surface;
   a light receiving element provided on the first surface;
   a light emitting element provided on the light receiving element;
   a MOSFET provided on the first surface, and
   the output terminal is connected to the MOSFET via at least one via wiring provided through the polyimide substrate, the via wiring having a diameter equal to or more than 20 μm and equal to or less than 150 μm.

2. The photorelay according to claim 1, wherein the polyimide substrate has a thickness equal to or more than 10 μm and equal to or less than 100 μm.

3. The photorelay according to claim 1, wherein the input terminal and the output terminal have a thickness equal to or more than 5 μm and equal to or less than 20 μm.

4. The photorelay according to claim 1, wherein the polyimide substrate has a thickness equal to or more than 10 μm and equal to or less than 60 μm.

5. The photorelay according to claim 1, wherein the polyimide substrate has a thickness equal to or more than 10 μm and equal to or less than 30 μm.

* * * * *